METHOD FOR PRODUCING P-I-N SEMICONDUCTORS

Filed Oct. 31, 1963

United States Patent Office 3,378,414

Patented Apr. 16, 1968

3,378,414

METHOD FOR PRODUCING P-I-N SEMICONDUCTORS

David Vernon Freck, Basingstoke, Robert Lindsay Rouse, Caversham, Reading, and James Wakefield, Woolhampton, England, assignors to Associated Electrical Industries Limited, London, England, a British company Filed Oct. 31, 1963, Ser. No. 320,338
Claims priority, application Great Britain, Nov. 2, 1962, 41,584/62
7 Claims. (Cl. 148—186)

Figure 1:
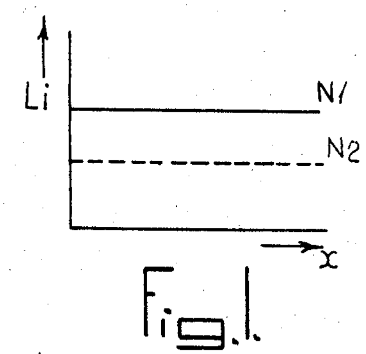

This invention relates to solid state devices in which a p-n junction is formed and has an important application inter alia in solid state radiation detectors for gamma and X-rays.

It is known to use devices embodying a reverse biased p-i-n junction for the detection of charged particles. In operation the devices are exposed to the radiation and when charged particles penetrate the depletion zone in the region of the p-i-n junction ionisation occurs and a reverse current pulse passes through the devices indicating the radiation. By pulse height analysis energy spectroscopy can be carried out.

Whilst such detectors are perfectly suitable for charged particles they have hitherto been unsuited to the spectroscopy of gamma and X-rays.

For detection of this type of radiation a thicker depletion layer is required than is necessary for particle detection.

Moreover, X-rays and gamma rays produce secondary $\beta$ particles in the depletion zone to cause pulse conduction.

These $\beta$ particles are mainly produced as the result of three effects, (i) The Compton effect.
(ii) Photo electric effect.
(iii) Pair production effects.

Since it is the energy of the secondary $\beta$ particle which determines the signal pulse height it is desirable that a single energy of secondary $\beta$ particle shall result from a single energy of incident gamma or X-ray. Whilst the second and third effects behave in this manner the first, i.e., the Compton, effect does not but gives readings over a wide energy band which makes spectroscopy difficult.

It is found, however, that the relative values of these effects varies with the atomic number of the semi-conductor material or materials forming the detector. With a material having a low atomic number the Compton effect predominates but with a material having a high atomic number the Compton effect is small compared with the photo electric and pair production effects and this renders possible accurate spectroscopy.

According to the present invention the method of manufacturing solid state p-n junction devices comprises a first stage in which lithium is diffused into a semi-conductor material having a conductivity state opposite to lithium so as partially to compensate the charge without changing the sign of the semi-conductor material, a second stage in which further lithium vapour is diffused part of the way through the semi-conductor so as to change the type of the semi-conductor material and form a p-n junction and a third stage in which a reverse bias is applied across the junction to form an intrinsic region between the opposite conductivity zones.

Preferably the semi-conductor material is silicon or germanium.

It will be appreciated that the actual junction is formed during the second stage and not during the first stage as the lithium added in the first stage is insufficient fully to compensate the charge on the semi-conductor and hence the type of semi-conductivity is unchanged. However, by employing the first stage the overall time required to carry out the process is appreciably reduced.

Figure 2:
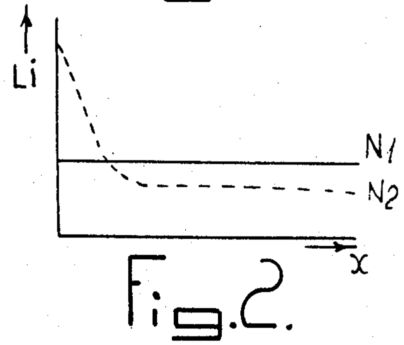
Figure 3:
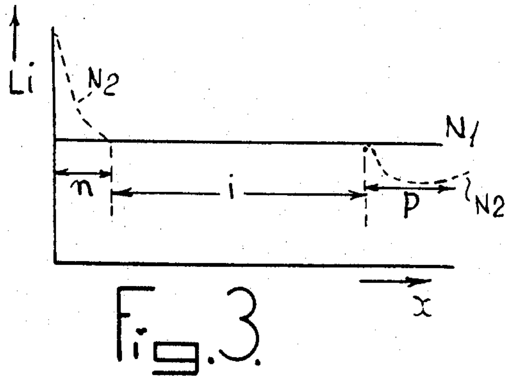

Reference will now be made to the accompanying drawing in which FIGS. 1–3 are graphs showing the distribution of lithium through the semi-conductor. In each figure lithium concentration is plotted against position in the semi-conductor.

In carrying out the invention the semi-conductor crystal initially containing a uniform concentration Ni (e.g., $10^{14}$–$10^{15}$ per cubic millimetre) of acceptor atoms, as shown in FIG. 1, is pre-compensated with lithium to a level of $N_2$ atoms/cc. The net concentration of acceptor atoms to be compensated is then N1–N2.

Lithium is then diffused into the crystal as previously described to give a distribution as shown by the dotted line in FIG. 2.

The intrinsic region is then formed by drifting the lithium wih a reverse electric field applied to give a distribution, as shown in FIG. 3.

Since the number of lithium ions now available to drift is still N1 however, the rate at which the intrinsic layer widens is increased $N1/N1\text{–}N2$ times the rate with the processes in which the initial compensation stage is omitted.

The initial compensation with lithium can be carried out, for example, by the following method. The total number of lithium atoms required to be introduced into the crystal is $N2.V$ a litttle less than $N1.V$, where V is the total volume. This required number of lithium atoms is first of all added to the crystal by an initial diffusion stage. This can be carried out by suitably applying lithium to the semi-conductor and heating. According to a preferred method the lithium is dissolved in an indium melt. In this way the surface concentration of the Li in the Ge is maintained at a constant value (preferably equal to the acceptor concentration). By accurate control of the concentration of the lithium in the melt an almost exact compensation can be produced. The diffusion is obtained for a sufficient time to allow the lithium concentration to become essentially uniform throughout the volume as shown in FIG. 1. The time required can be calculated from the known diffusion coefficient (D) at the diffusion temperature, e.g., about 250° C. Any excess lithium on the surface is then removed, for example, by selective etching. The degree of compensation reached can be obtained from resistivity measurements.

In principle this technique can be used for any initial acceptor concentration, simply by altering the lithium concentration in the indium melt. There may, however, be a preferred range of acceptor concentrations, between about 5 and about 20 ohm-cms.

According to an alternative method, the initial compensation may be carried out by evaporating lithium on to the surface, and then heating to diffuse in the required number of lithium atoms, calculated from the known equilibrium surface concentration ($C_S$) and known diffusion coefficient, both at the diffusion temperature, e.g., about 200° C. and given by $$\frac{2}{\sqrt{\pi}}\sqrt{Dt.}\ C_S$$

Any excess lithium on the surface is then removed as before. The crystal is then heated to a higher temperature (e.g., about 300–400° C.) for a given time (calculated from the known diffusion constant of lithium and the dimensions) sufficient to allow the lithium to distribute itself essentially uniformly throughout the crystal.

In carrying out the second stage. i.e., forming the p-n junction, the lithium source may be located in a stream of inert gas, e.g., argon, and heated preferably to about 700° C. The semi-conductor, e.g., germanium, would also be located in the inert gas stream and heated, e.g., to about 200° C.

The semi-conductor would, of course, be located downstream of the lithium source so that the lithium vapour is deposited on the semi-conductor and diffuses into it.

A reverse bias would then be applied at the junction at a lower temperature, e.g., 70° C., and for a sufficient length of time to produce the requisite thickness of depletion layer.

As above explained, the rate of widening of the intrinsic region of width W when the reverse electric field is applied is inversely proportional to the density of the acceptor atoms to be compensated and proportional to the number of lithium atoms available to drift under the influence of the electric field.

Whilst the invention has been more particularly described in connection with radiation detectors its application is not so limited but the process may be employed for producing transistors having an intrinsic layer and which are intended for other applications.

What we claim is:

1. The method of manufacturing solid state p-n junction devices consisting in diffusing lithium into a semiconductor material of a conductivity type opposite to lithium so as partially to compensate the charge throughout the semi-conductor without changing the type of conductivity, then diffusing further lithium vapour part of the way through the semi-conductor so as to change the type of the conductivity and form a p-n junction and thereafter applying a reverse electrical bias across the junction to form an intrinsic region between the opposite conductivity zones.

2. The method of manufacturing solid state p-n junction devices consisting in diffusing lithium into a semiconductor material of the group consisting of silicon and germanium so as partially to compensate the charge throughout the semi-conductor without changing the type of conductivity of the semi-conductor material, then diffusing further lithium vapour part of the way through the semi-conductor so as to change the type of conductivity of the semi-conductor material and form a p-n junction and thereafter applying a reverse electrical bias across the junction to form an intrinsic region between the opposite conductivity zones.

3. The method of manufacturing solid state p-n junction devices consisting in diffusing lithium into a semiconductor material of the group consisting of silicon and germanium so as partially to compensate the charge throughout the semi-conductor without changing the type of conductivity of the semi-conductor material, then locating the semi-conductor downstream of lithium in a stream of inert gas and heating the lithium and semi-conductor to diffuse further lithium part of the way through the semi-conductor so as to change the type of conductivity of the semi-conductor material and form a p-n junction and thereafter applying a reverse electrical bias across the junction whilst heating the semi-conductor to form an intrinsic region between the opposite type conductivity zones.

4. The method of manufacturing solid state p-n junction devices consisting in diffusing lithium into a semiconductor material of the group comprising silicon and germanium so as partially to compensate the charge throughout the semi-conductor without changing the type of conductivity of the semi-conductor material, diffusing further lithium vapour part of the way through the semiconductor in a stream of inert gas whilst the semi-conductor is heated to about 200° C. and the lithium is heated to about 700° C. so as to change the type of conductivity of the semi-conductor material and form a p-n junction and thereafter applying a reverse electrical bias across the junction and heating said semi-conductor to about 70° C. to form an intrinsic region between the opposite type conductivity zones.

5. The method of manufacturing solid state p-n junction devices consisting in diffusing lithium vapour in a stream of inert gas into a semi-conductor material of a conductivity type opposite to lithium so as partially to compensate the charge throughout the semi-conductor without changing the type of conductivity of the semiconductor material, then diffusing further lithium vapour part of the way through the semi-conductor so as to change the type of conductivity of the semi-conductor material and form a p-n junction and thereafter applying a reverse electrical bias across the junction to form an intrinsic region between the opposite type conductivity zones.

6. The method of manufacturing solid state p-n junction devices consisting in applying lithium in an indium melt to a semi-conductor material of a conductivity type opposite to lithium so as partially to compensate the charge throughout the semi-conductor without changing the type of conductivity of the semi-conductor material, then diffusing further lithium vapour part of the way through the semi-conductor so as to change the type of conductivity of the semi-conductor material and form a p-n junction and thereafter applying a reverse electrical bias across the junction to form an intrinsic region between the opposite type conductivity zones.

7. The method of manufacturing solid state p-n junction devices consisting in applying lithium in an indium melt to a semi-conductor material of the group consisting of silicon and germanium so as partially to compensate the charge throughout the semi-conductor without changing the type of conductivity of the semi-conductor material, then diffusing further lithium vapour part of the way through the semi-conductor so as to change the type of conductivity of the semi-conductor material and form a p-n junction and thereafter applying a reverse electrical bias across the junction to form an intrinsic region between the opposite type conductivity zones.

References Cited

UNITED STATES PATENTS

| | | | |
|---|---|---|---|
| 3,016,313 | 1/1962 | Pell | 148—188 |
| 3,225,198 | 12/1965 | Mayer | 148—188 |
| 2,817,799 | 12/1957 | Jenny | 148—185 |
| 2,834,697 | 5/1958 | Smits | 148—189 |

HYLAND BIZOT, *Primary Examiner.*

RICHARD O. DEAN, *Examiner.*